US012575387B2

(12) United States Patent
Chuang et al.

(10) Patent No.: US 12,575,387 B2
(45) Date of Patent: Mar. 10, 2026

(54) METHOD FOR FABRICATING A SEMICONDUCTOR DEVICE

(71) Applicant: Taiwan Semiconductor Manufacturing Company, Ltd., Hsin-Chu (TW)

(72) Inventors: Harry-Hak-Lay Chuang, Singapore (SG); Bao-Ru Young, Zhubei City (TW); Wei Cheng Wu, Zhubei City (TW); Meng-Fang Hsu, Hsinchu City (TW); Kong-Pin Chang, Caotun Township (TW); Chia Ming Liang, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 412 days.

(21) Appl. No.: 18/360,546

(22) Filed: Jul. 27, 2023

(65) Prior Publication Data

US 2023/0377942 A1 Nov. 23, 2023

Related U.S. Application Data

(60) Continuation of application No. 16/908,027, filed on Jun. 22, 2020, now Pat. No. 11,869,800, which is a continuation of application No. 15/978,579, filed on May 14, 2018, now Pat. No. 10,692,750, which is a (Continued)

(51) Int. Cl.

| | |
|---|---|
| *H01L 21/76* | (2006.01) |
| *H01L 21/265* | (2006.01) |
| *H01L 21/762* | (2006.01) |
| *H10D 30/01* | (2025.01) |
| *H10D 30/60* | (2025.01) |

(Continued)

(52) U.S. Cl.
CPC ........ *H01L 21/76* (2013.01); *H01L 21/26533* (2013.01); *H01L 21/2658* (2013.01); *H01L 21/76224* (2013.01); *H10D 30/0278* (2025.01); *H10D 30/608* (2025.01); *H10D 30/751* (2025.01); *H10D 62/113* (2025.01)

(58) Field of Classification Search
CPC .................... H10D 30/751; H10D 62/113–116
See application file for complete search history.

(56) References Cited

U.S. PATENT DOCUMENTS

| | | | |
|---|---|---|---|
| 6,221,724 | B1 | 4/2001 | Yu |
| 6,271,551 | B1 | 8/2001 | Schmitz |
| 9,111,057 | B2 | 8/2015 | Radibratovic |

(Continued)

FOREIGN PATENT DOCUMENTS

| | | |
|---|---|---|
| TW | 200425404 A | 11/2004 |

*Primary Examiner* — Amar Movva
(74) *Attorney, Agent, or Firm* — Haynes and Boone, LLP

(57) ABSTRACT

A method for fabricating a semiconductor device includes receiving a silicon substrate having an isolation feature disposed on the substrate and a well adjacent the isolation feature, wherein the well includes a first dopant. The method also includes etching a recess to remove a portion of the well and epitaxially growing a silicon layer (EPI layer) in the recess to form a channel, wherein the channel includes a second dopant. The method also includes forming a barrier layer between the well and the EPI layer, the barrier layer including at least one of either silicon carbon or silicon oxide. The barrier layer can be formed either before or after the channel. The method further includes forming a gate electrode disposed over the channel and forming a source and drain in the well.

20 Claims, 11 Drawing Sheets

Related U.S. Application Data division of application No. 13/793,220, filed on Mar. 11, 2013, now Pat. No. 9,972,524.

(51) Int. Cl.
*H10D 30/69*  (2025.01)
*H10D 62/10*  (2025.01)

(56)  References Cited

U.S. PATENT DOCUMENTS

| | | | |
|---|---|---|---|
| 9,112,057 | B1 | 8/2015 | Pradhan |
| 2005/0285212 | A1 | 12/2005 | Tolchinsky |
| 2009/0108352 | A1 | 4/2009 | Majumdar |
| 2010/0035422 | A1 | 2/2010 | Leung |
| 2011/0215376 | A1 | 9/2011 | Holt |
| 2012/0015514 | A1 | 1/2012 | Noguchi |
| 2012/0018779 | A1 | 1/2012 | Laermer |
| 2013/0082318 | A1 | 4/2013 | Liu |
| 2014/0252504 | A1 | 9/2014 | Chuang |
| 2018/0269099 | A1 | 9/2018 | Chuang |

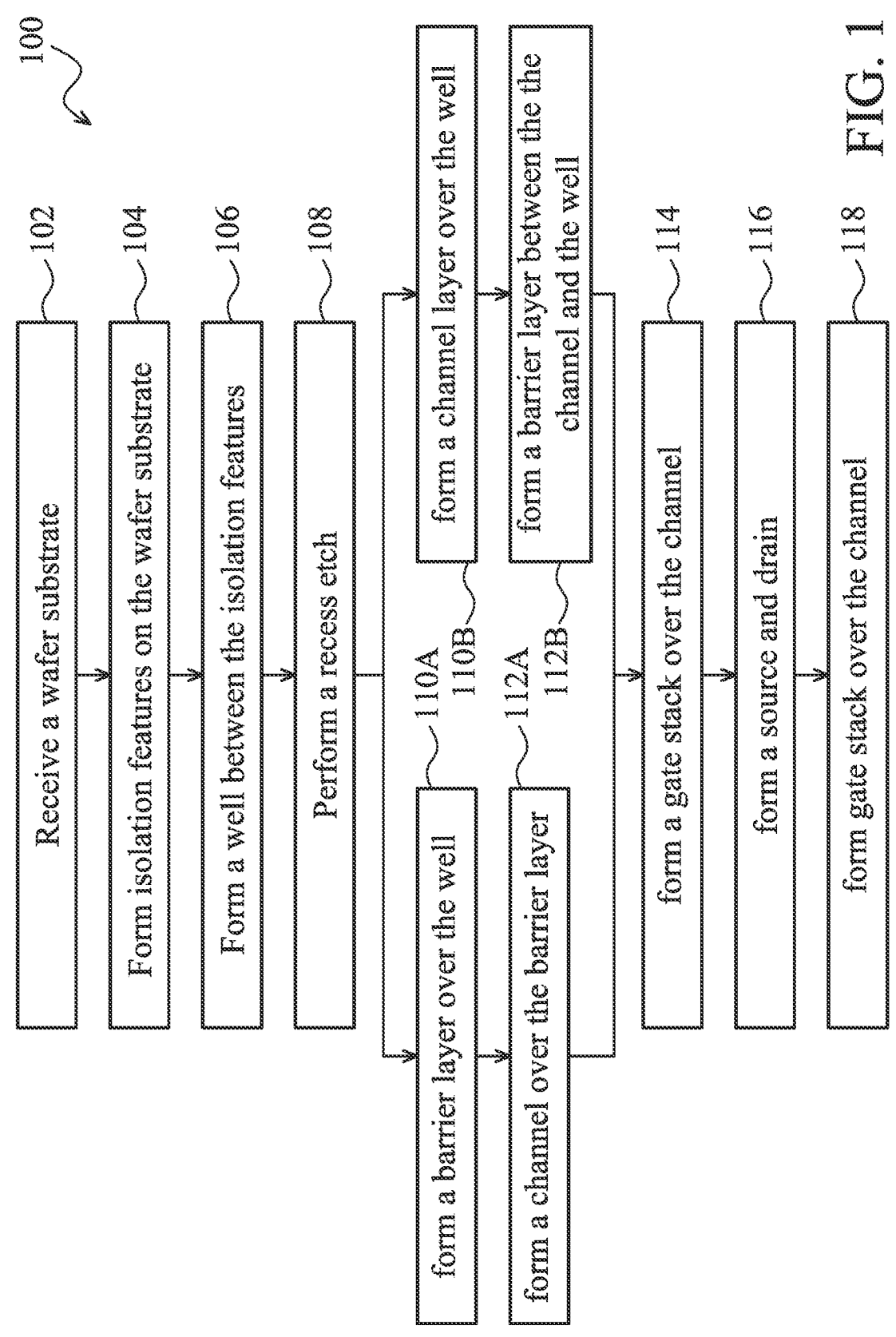

100

102 — Receive a wafer substrate

104 — Form isolation features on the wafer substrate

106 — Form a well between the isolation features

108 — Perform a recess etch

110A — form a barrier layer over the well
110B — form a channel layer over the well 112A — form a channel over the barrier layer
112B — form a barrier layer between the the channel and the well 114 — form a gate stack over the channel 116 — form a source and drain 118 — form gate stack over the channel

METHOD FOR FABRICATING A SEMICONDUCTOR DEVICE

PRIORITY DATA

The present application is a continuation of U.S. application Ser. No. 16/908,027, filed Jun. 22, 2020, which is a continuation of U.S. application Ser. No. 15/978,579, filed May 14, 2018, which is a divisional of U.S. application Ser. No. 13/793,220, filed Mar. 11, 2013, now U.S. Pat. No. 9,972,524, each of which is herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. One development in the scaling down process is the use of fin field effect transistors (Fin-FETs). However, the FinFET transistor greatly increases process complexity and therefore the cost of fabricating the FinFET transistor.

BRIEF DESCRIPTION OF THE DRAWINGS

The present disclosure is best understood from the following detailed description when read with accompanying figures. It is emphasized that, in accordance with the standard practice in the industry, various features are not drawn to scale and are used for illustration purpose only. In fact, the dimension of the various features may be arbitrarily increased or reduced for clarity of discussion.

FIG. 1 is a flow chart of a method for fabricating a semiconductor device for benefiting from one or more embodiments.

DETAILED DESCRIPTION

Figure 2:
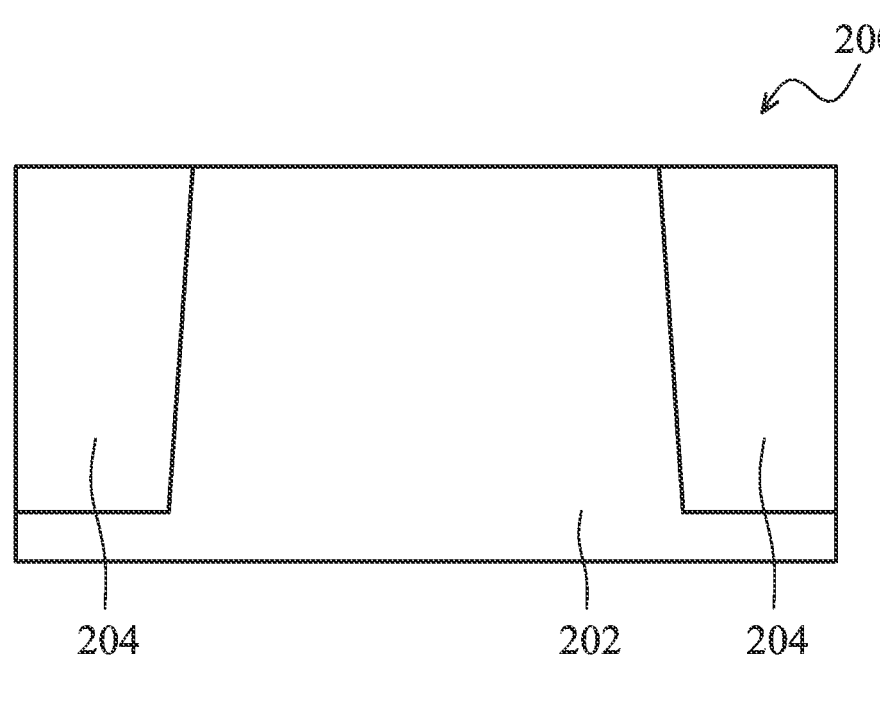
FIGS. 2-8 are cross sectional views of forming a semiconductor device using a method according to one or more embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Referring to FIG. 1, a flow chart of a method 100 for fabricating a semiconductor device is illustrated. FIGS. 2-8 are cross sectional views of forming a semiconductor device 200 using the method 100. In the present embodiments, a semiconductor device is also referred to as a semiconductor structure or a transistor. It is understood that additional steps can be provided before, during, and after the method 100, and some the steps described can be replaced, eliminated, or moved around for additional embodiments of the method 100. The method 100 is an example embodiment, and is not intended to limit the present invention beyond what is explicitly recited in the claims.

The method 100 begins at step 102 by receiving or providing a wafer substrate. In some embodiments, the wafer substrate is a silicon wafer. Alternatively or additionally, the substrate includes another elementary semiconductor, such as germanium; a compound semiconductor including silicon carbide, gallium arsenic, gallium phosphide, indium phosphide, indium arsenide, and/or indium antimonide; or an alloy semiconductor including SiGe, GaAsP, AlInAs, AlGaAs, GaInAs, GaInP, and/or GaInAsP. In other alternatives, the wafer substrate includes a semiconductor on insulator (SOI) structure. The wafer substrate includes one or more conductive and/or dielectric films. In the various embodiments, the dielectric film includes silicon oxide, high k dielectric material film, or a combination of silicon oxide and high k dielectric material, and the conductive thin film for the gate electrode film includes doped polysilicon, or a metal, such as aluminum (Al), copper (Cu), tungsten (W), nickel (Ni), titanium (Ti), gold (Au), platinum (Pt) or alloy of the metals thereof. In one embodiment, the wafer substrate includes a doped epitaxial (EPI) layer, for example, boron doped P-type (positive charger) Si EPI layer.

The method 100 proceeds to step 104 by forming an isolation feature embedded in the wafer substrate. The isolation feature is used to isolate a plurality of wells, such as a P-well or an N-well, to be formed on the wafer substrate; P standing for positive charge (e.g. a hole) and N for negative charge (e.g. en electron). In some embodiments, the isolation feature is a shallow trench isolation (STI) feature. In other embodiments, the isolation feature includes silicon oxide, silicon nitride, or silicon nitride-oxide in one or more layers. The isolation feature may also include other isolation material.

One way of forming an isolation feature uses a lithography process, such as depositing a resist film on the wafer substrate, exposing the resist film deposited on the wafer substrate according to a pattern and developing the exposed resist film to form a resist pattern on the wafer substrate. The resist pattern is transferred to the wafer substrate by etching, such as dry etching or wet etching, a trench in the wafer substrate. A deposition process, such as a chemical vapor deposition (CVD) or a physical vapor deposition (PVD) is then used to fill the trench with an isolation material, such as silicon oxide, silicon nitride, or silicon nitride-oxide in one or more layers. A chemical mechanical polishing (CMP) process is used to remove any excess isolation material and planarize a surface of the wafer substrate. FIG. 2 is a cross sectional diagram including an isolation feature 204 embedded into a wafer substrate 202.

Figure 3:
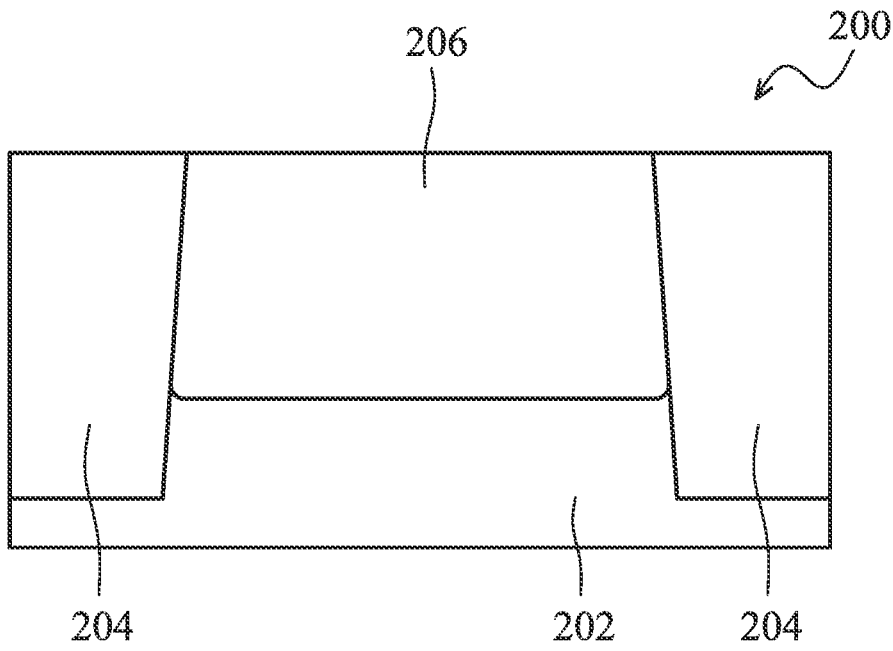

The method 100 proceeds to step 106 by forming a well in the wafer substrate. The well is surrounded by the isolation features. In other words, the well is isolated by the isolation feature. In some embodiments, the well includes a P-well for a NMOS (metal on silicon) transistor or an N-well for a PMOS transistor. The P-well is formed by using a positive charged dopant and the N-well is formed by using a negative charged dopant. In the present embodiment, a dopant used for forming a well is referred to as a first dopant. A lithography process is optionally used to define a location and dimension of an implant, and protect other area from the implant. An ion implantation process, such as boron for the P-well or phosphorus for a N-well, implants the first dopant into the well. FIG. 3 is a cross sectional diagram including a well 206 is disposed between the isolation features 204 embedded in the wafer substrate 202.

Figure 4:
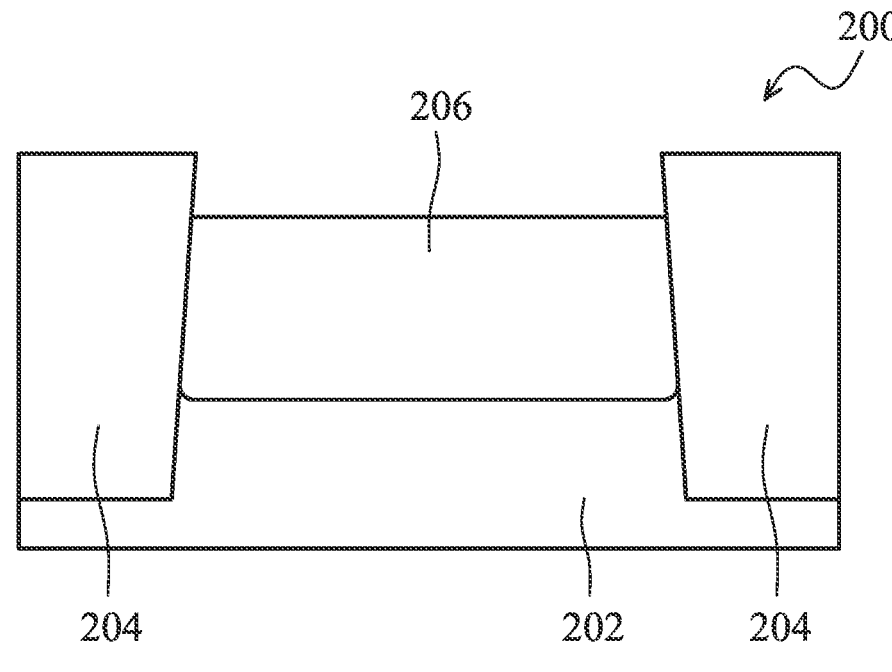

The method 100 proceeds to step 108 by performing a recess etching process to remove a portion of the well isolated by the isolation feature. In the present embodiments, the etching process removes approximately 5 to 20 nm of the well, which has a height (well height) ranging from approximate 60 to 70 nm. FIG. 4 shows a removed portion of the well 206 disposed between the isolation features 204.

After step 108, the method 100 forms a barrier layer and a channel layer in the recess. There are different ways to form the channel layer and the barrier layer over the well. FIG. 1 shows two alternative options, labeled A and B.

Figures 5A, 5B:
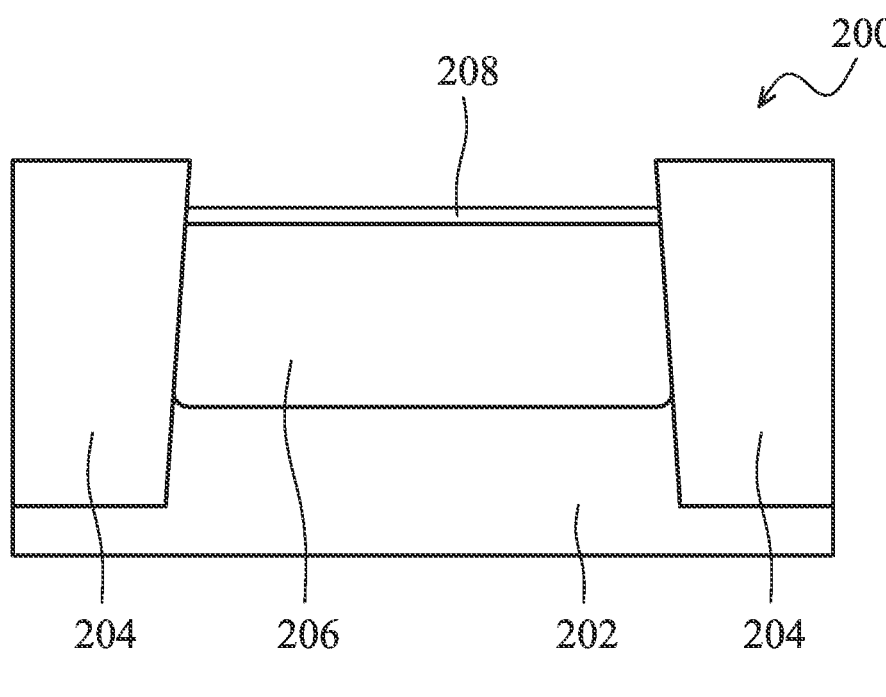

Referring to option A of FIG. 1, after step 108, the method 100 proceeds to step 110A to form a barrier layer over the well. The barrier layer is about 3 to 10 nm thick. In one embodiment, an $O_2$ implant process implants oxygen into the well at the recess to create a silicon oxide barrier layer. For example, the $O_2$ implant process applies $O_2$ at a concentration ranging from approximate $100 \times 10^4$ to $100 \times 10^5$ parts per million (ppm) under an electric field voltage ranging from approximate 2K to 5K volts at a tilt angle of about zero degrees over surface of the well. In another embodiment, a carbon process implants carbon into the well at the recess to create a silicon carbide barrier layer. FIG. 5A shows a barrier layer 208 formed over the well 206.

Figure 6:
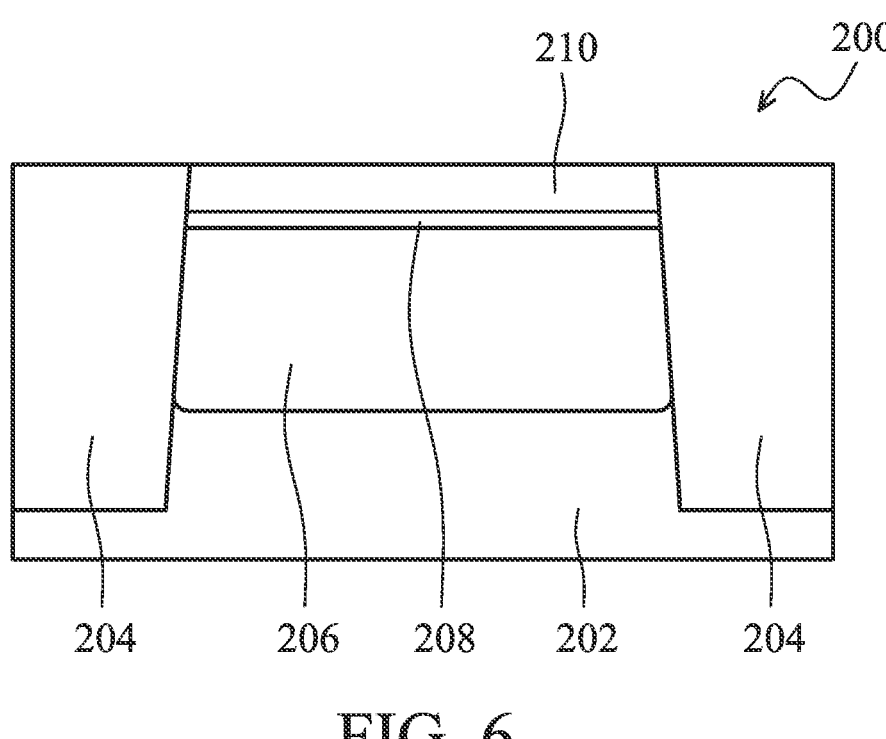

Continuing with option A, the method 100 proceeds to step 112A by forming the channel layer over the barrier layer. In one embodiment, the channel layer is formed by epitaxially growing a silicon layer (EPI layer) in the recess. In some embodiments, the EPI layer increases mobility of a charge, such as a positive charge or a negative charge, and therefore improves performance of the device. FIG. 6 shows a channel layer 210 disposed on the barrier layer 208.

Referring now to option B of FIG. 1, after step 108, the method 100 proceeds to step 110B to form the barrier layer and the channel layer. In the present embodiment, and as discussed with reference to option A, the channel layer is a Si EPI layer and has a thickness from about 5 to 20 nm. FIG. 5B shows the channel layer 210 disposed over the well 206.

Continuing with option B, the method 100 proceeds to step 112B by forming the barrier layer between the channel layer and the well. In one embodiment, the barrier layer includes silicon oxide and has a thickness of about 3 to 10 nm. The barrier layer is formed using an implantation process through the channel layer, such as an $O_2$ implantation process. As with option A, in one embodiment, the $O_2$ implantation process includes applying $O_2$ at a concentration ranging from approximate $100 \times 10^4$ to $100 \times 10^5$ ppm under an electric field voltage ranging from approximate 2K to 5K volts at a tilt angle of about zero degrees over surface of the well. FIG. 6 shows the barrier layer 208 formed between the channel layer 210 and the well 206.

Figure 7:
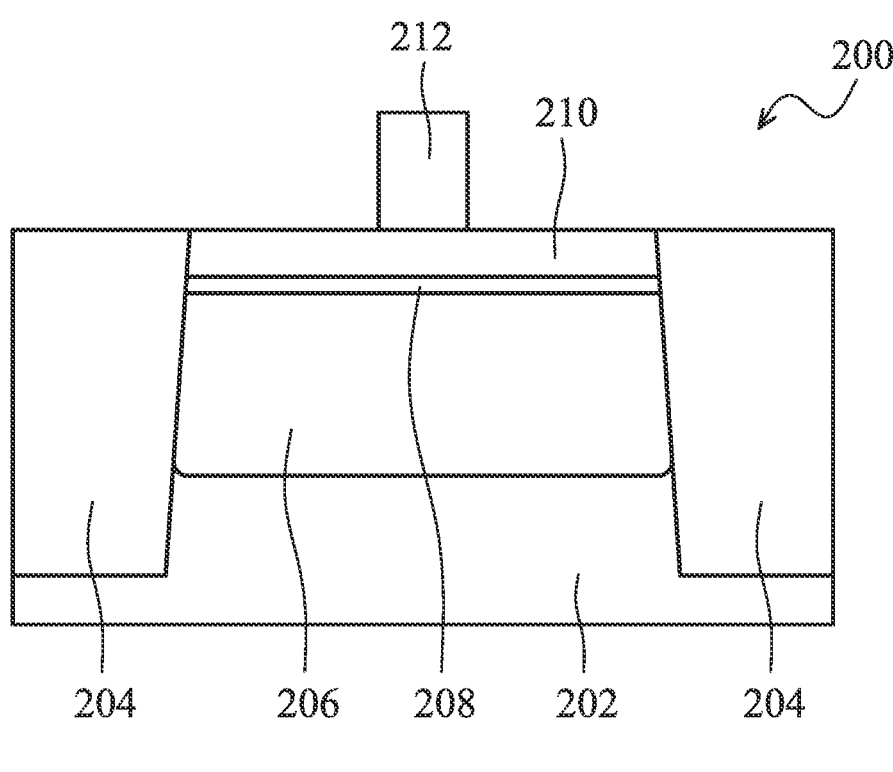

After either option A or B, the method 100 proceeds to step 114 by forming a gate electrode over the channel layer. The gate electrode includes an interfacial layer and a gate layer disposed over the interfacial layer. In various embodiments, the interfacial layer includes silicon oxide or a high-k dielectric material layer. Also in various embodiments, the gate layer includes polysilicon or metal layer. One way forming a gate electrode includes using a deposition process, such as CVD, PVD, or an electro-plating process to deposit a gate material. A lithography process and etching process patterns the gate. FIG. 7 shows a gate electrode 212 disposed over the channel layer 210.

The method 100 proceeds to step 116 by forming source and drain regions. Forming the source and drain includes forming a light doped drain (LDD) region and forming heavier doped regions using a spacer formed along the sidewalls of the gate electrode. The spacer includes silicon oxide or high-k dielectric material. The source includes a P-source or an N-source, and the drain includes a P-drain or an N-drain. In the present embodiments, a dopant used for forming a source/drain is referred to as a second dopant. Step 116 includes using an implantation process. Forming the source and drain also includes using a deposition process.

Figure 8:
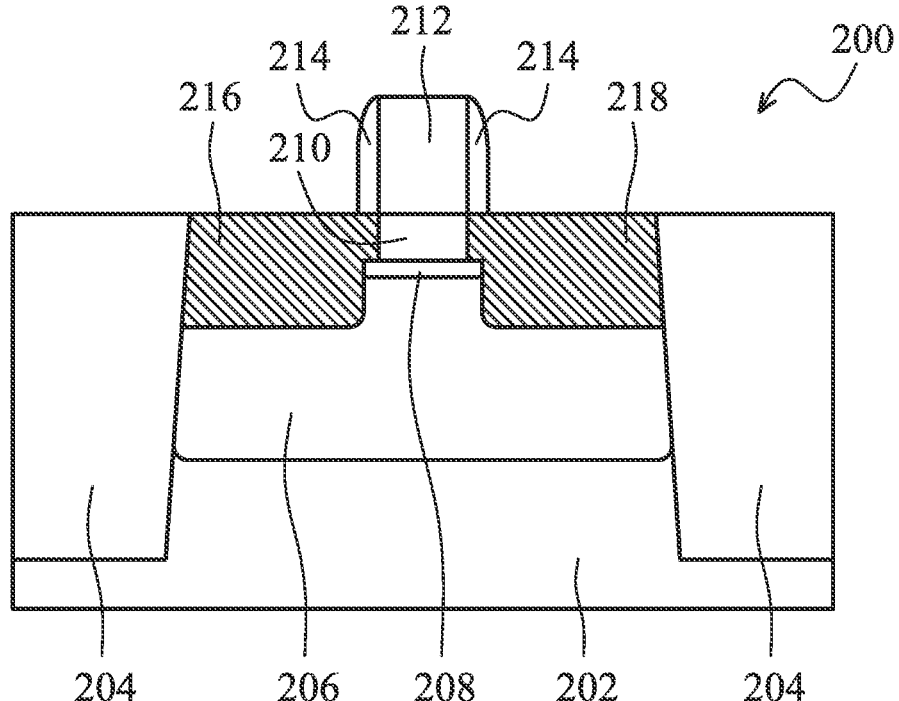

FIG. 8 shows the semiconductor device 200 including a spacer 214 disposed along sidewalls of the gate electrode 212, and a source 216 and a drain 218 formed on opposite sides of the gate electrode. It is understood that FIG. 8 is provided as an example, and other configurations and inclusion or omission of various items in the device 200 is possible.

Figure 9A:
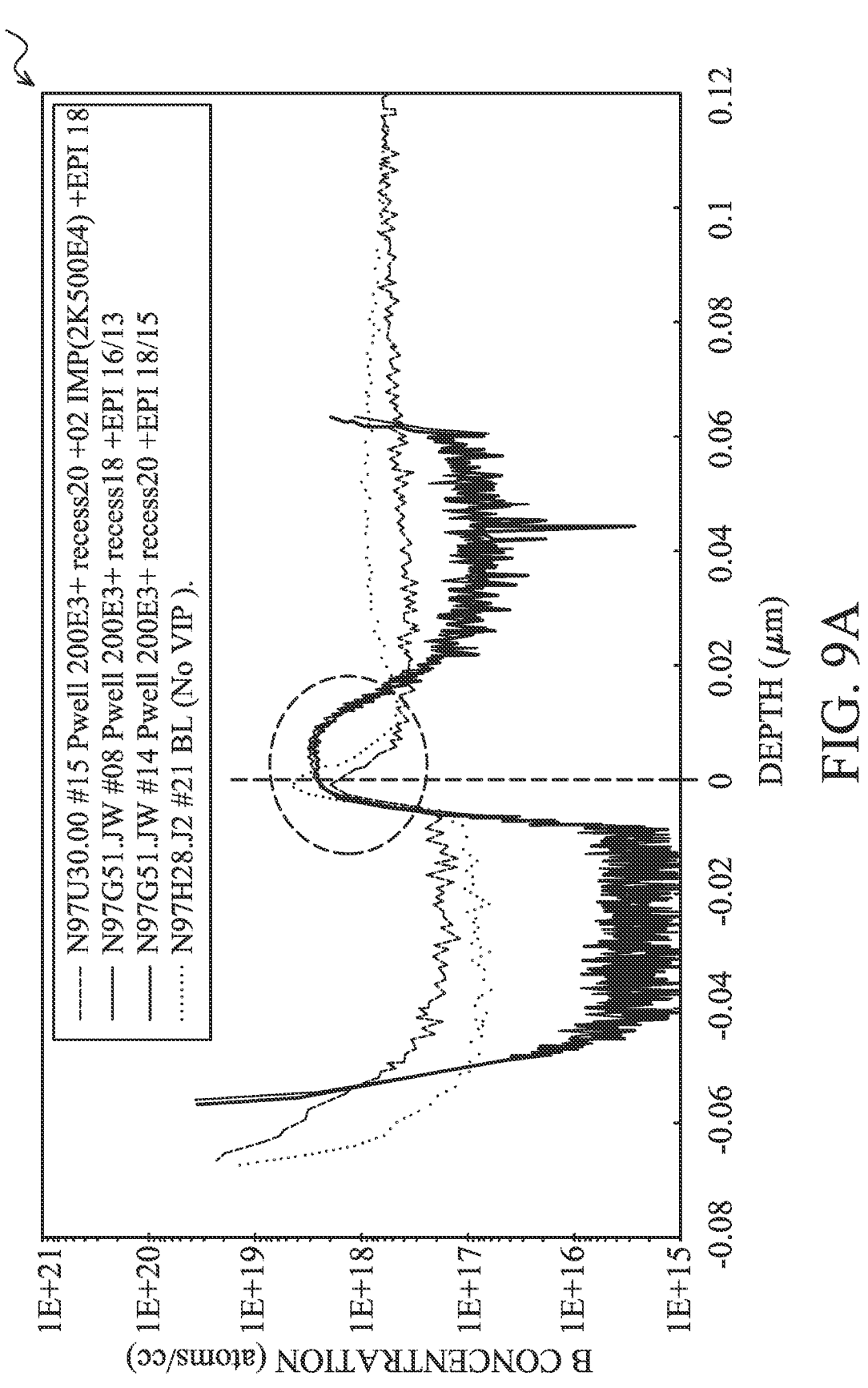
FIGS. 9A and 9B are an example of a barrier layer reducing a dopant migrating from a well through a channel into an interfacial layer of a gate electrode according to one or more embodiments.
Figure 9B:
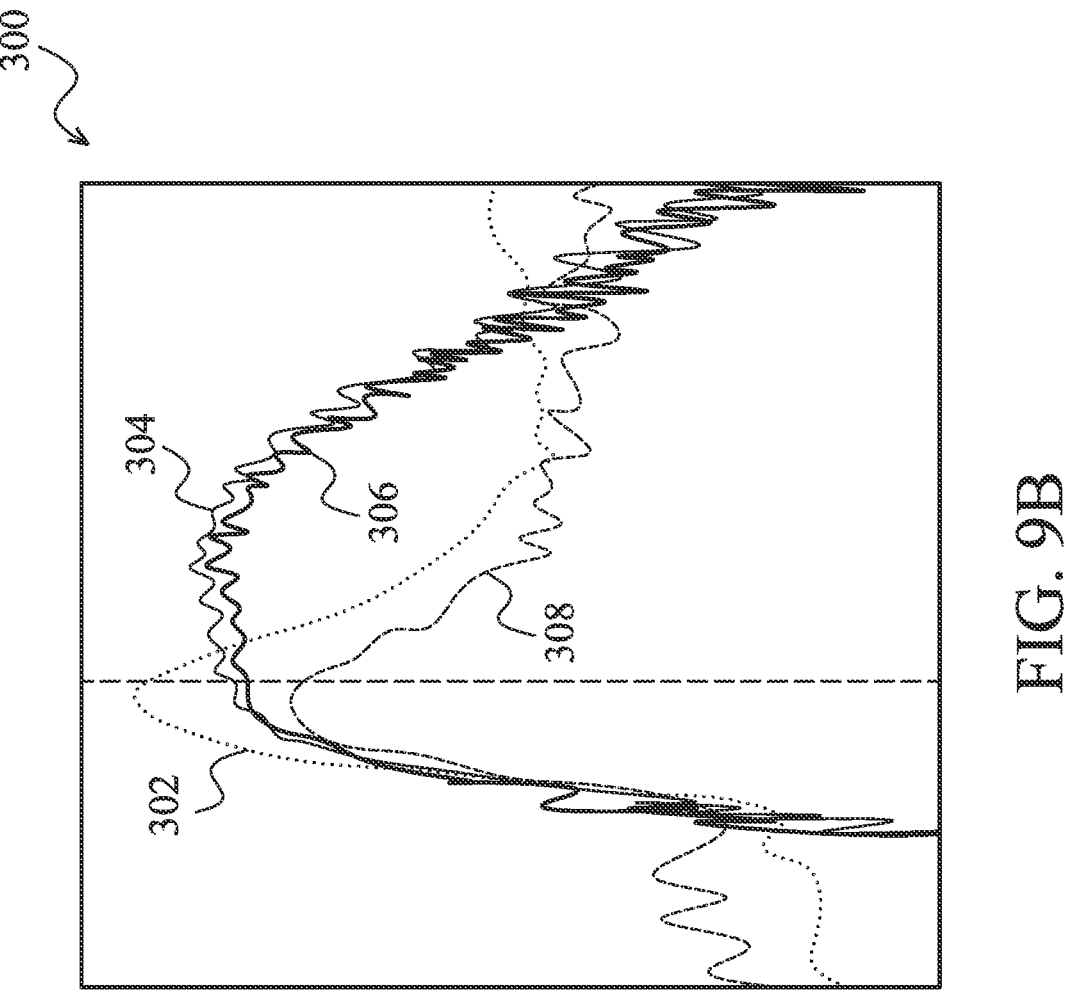

FIGS. 9A and 9B illustrate examples 300 of how the barrier layer reduces dopant (e.g. boron) migration from a well, through the channel layer (e.g. Si EPI layer), and into an interfacial layer of a gate electrode. FIG. 9A represents element boron concentration profiles at the interface of the interfacial layer of the gate electrode and the Si EPI layer with or without the EPI layer or the barrier layer by using a surface chemical analysis tool, such as a secondary ion mass spectrometer (SIMS). FIG. 9B is an enlarged illustration of FIG. 9A, at the interface of the interfacial layer of the gate electrode.

The examples 300 include a profile 302 (baseline profile), a profile 304, a profile 306, and a profile 308. The profile 302 represents boron concentration at an interface area of an interfacial layer of a gate electrode and a channel without an EPI layer between the interfacial layer of the gate electrode and the well. The profiles 304 and 306 represent boron concentration at an interface area of an interfacial layer of a gate electrode and an EPI layer (channel) without a barrier layer. The profile 304 is from an EPI layer with a thickness of approximately 16 nm and the profile 306 is from an EPI layer with a thickness of approximately 18 nm. The profile 308 represents boron concentration at the interface area of an interfacial layer of a gate electrode and a Si EPI layer with a barrier layer between it and the well, as taught in the previous discussion and figures. In the examples 300, the Si EPI layer reduces about 30% of the boron in an interfacial layer of a gate electrode as shown in the profiles 304 and 306, as compared with the profile 302. The Si EPI layer with a barrier layer, such as an $O_2$ implant layer, reduces about 58% of the boron in an interfacial layer of a gate electrode as shown in the profile 308 compared with the profile 302.

Figure 10:
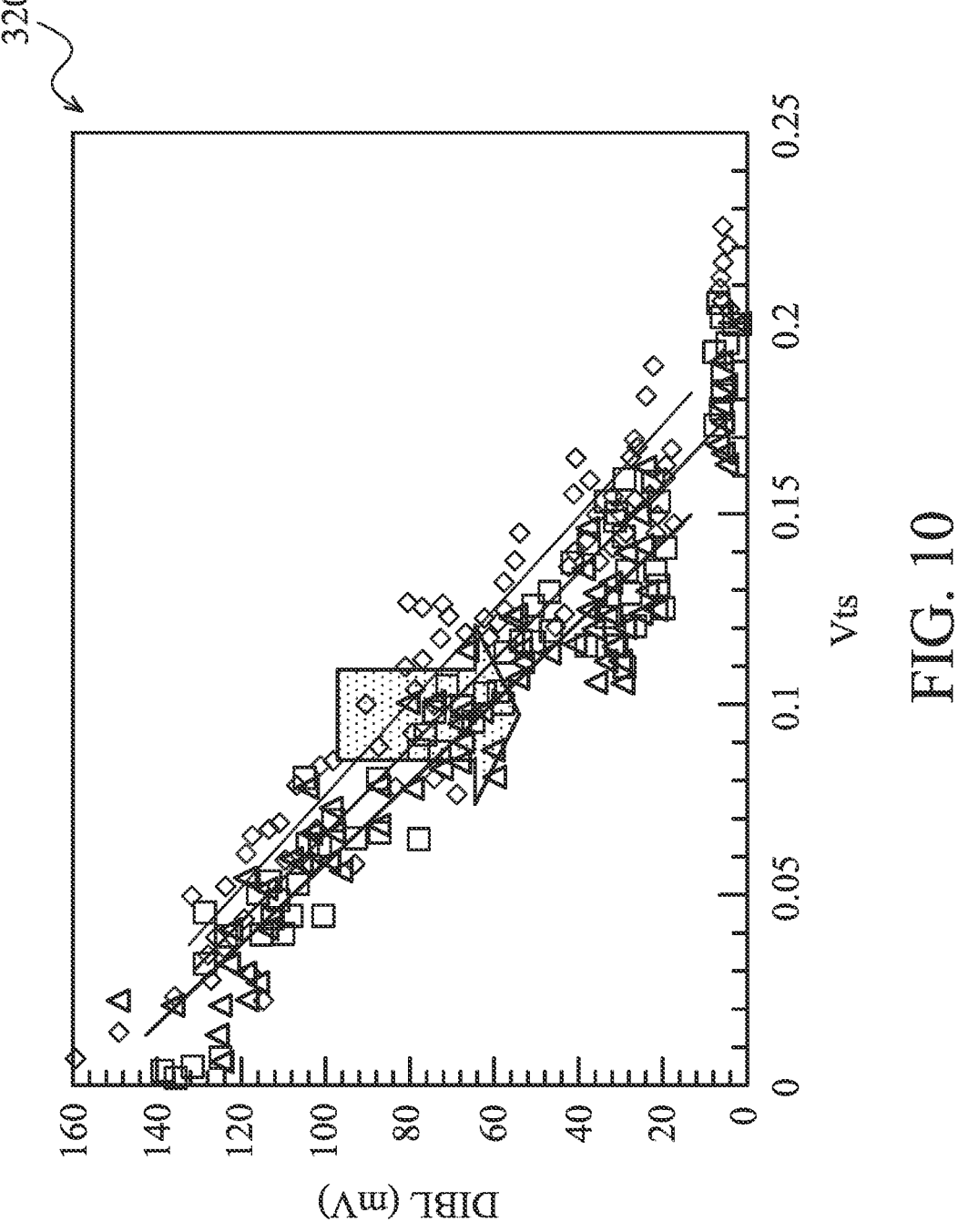
FIG. 10 is an example of a barrier layer improving drain induced barrier lowering (DIBL) of a transistor according to one or more embodiments.

FIG. 10 is a sample 320 of a barrier layer improving a drain induced barrier lowering (DIBL) value of a transistor, such as an NMOS transistor. A trend line 322 is for an NMOS transistor without an EPI layer as a channel; a trend line 324 is for an NMOS transistor with an $O_2$ implant barrier layer formed before the Si EPI layer; and a trend line 326 is for an NMOS transistor with an $O_2$ implant barrier layer formed after the Si EPI layer. In the sample 320, the DIBL is improved from approximate 10 to 15 mV with the barrier formed before or after an EPI layer is grown by comparing the trend line 322 with the trend line 324 or the trend line 326.

Figure 11:
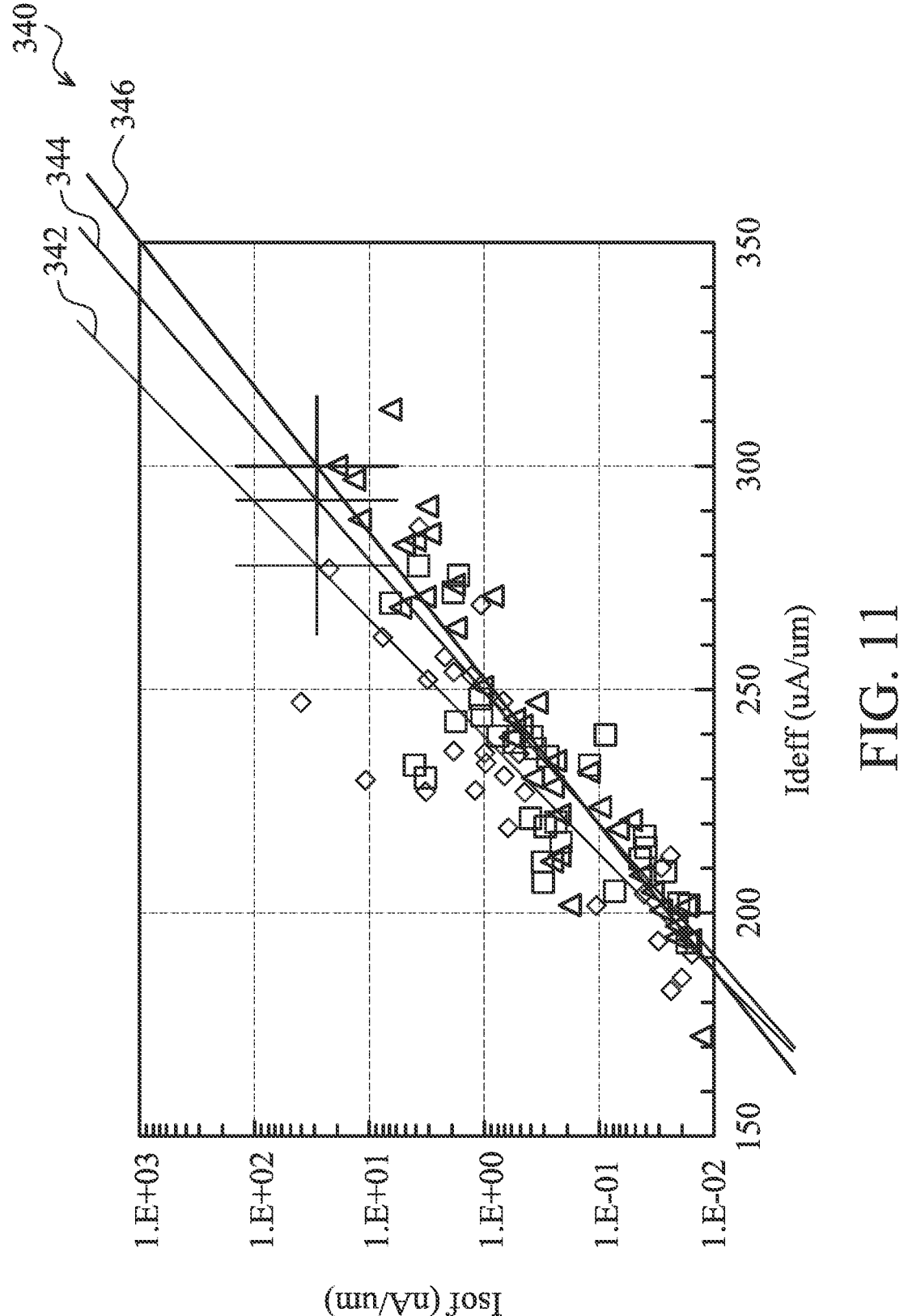
FIG. 11 is an example of a barrier layer improving an effective drain current (Ideff) vs. a source side off current in saturation region (Isoff) of a transistor according to one or more embodiments.

FIG. 11 is a sample 340 showing how the barrier layer improves an effective drain current (Ideff) vs. a source side off current in saturation region (Isoff) of a transistor, such as a PMOS transistor. A trend line 342 is for a PMOS transistor without an EPI layer; a trend line 344 is for a PMOS transistor with an $O_2$ implant barrier layer formed before the Si EPI layer; and a trend line 346 is for a PMOS transistor with an $O_2$ implant barrier layer formed after the Si EPI layer. The trend line 344 shows that the Ideff-Isoff is improves by about 5% with an $O_2$ implant barrier formed before the Si EPI layer, as compared to the trend line 342, and the trend line 346 shows that Ideff-Isoff improves by about 8% with an $O_2$ implant barrier formed after the Si EPI layer, as compared to the trend line 342.

Figure 12:
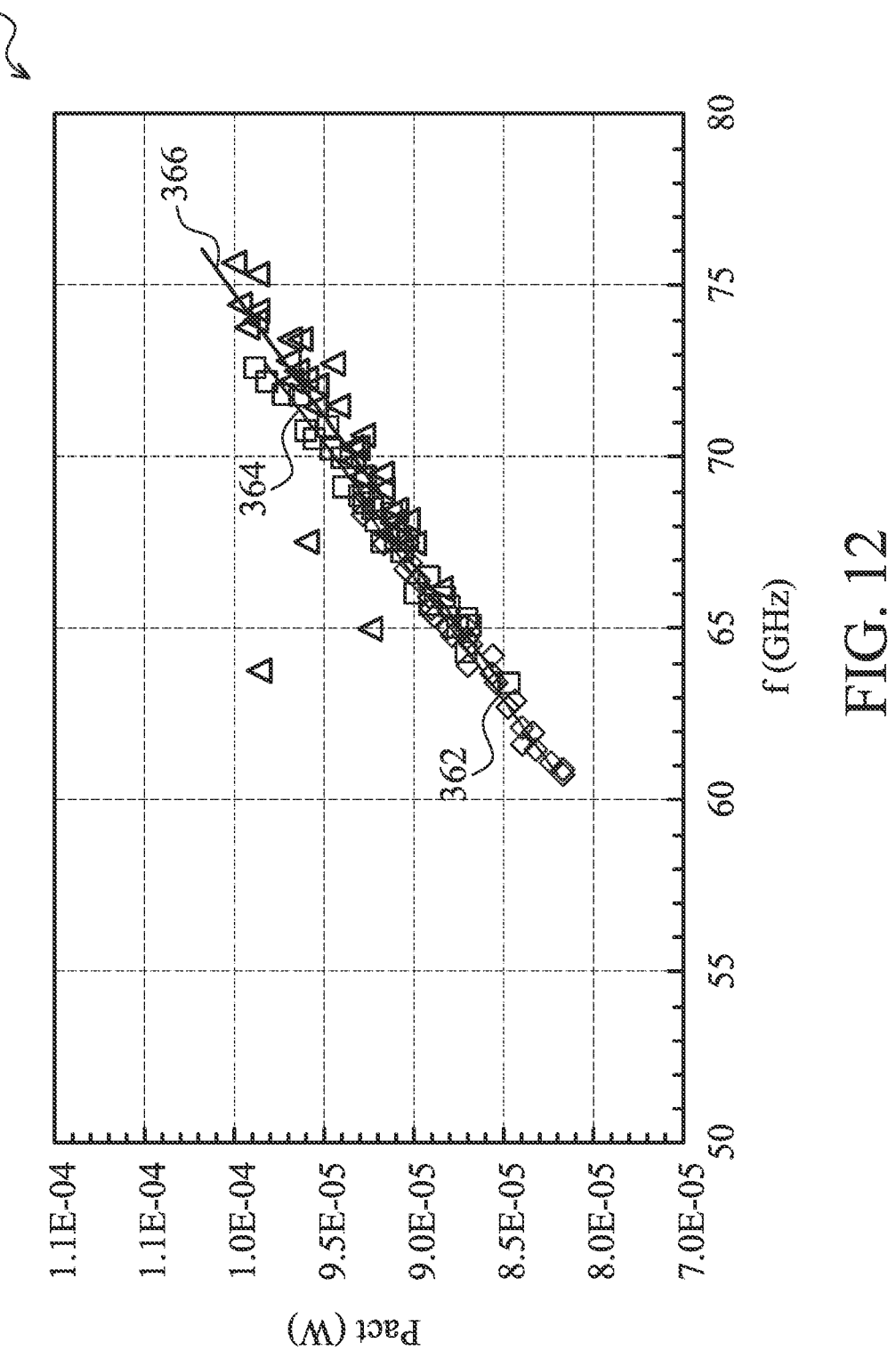
FIG. 12 is an example of a barrier layer improving speed, such as frequency (f), and a consumed active power (W) of a transistor according to one or more embodiments.

FIG. 12 is a sample 360 showing how the barrier layer improves consumed active power (W) and frequency (f) of a PMOS transistor. A trend line 362 is for a PMOS transistor without an EPI layer; a trend line 364 is for a PMOS transistor with an $O_2$ implant barrier layer formed before the Si EPI layer; and a trend line 366 is for a PMOS transistor with an $O_2$ implant barrier layer formed after the Si EPI layer. The trend line 364 shows that the power-frequency (W-f) is improved by about 0.5% with an $O_2$ implant barrier formed before the Si EPI layer, as compared to the trend line 362, and trend line 366 shows that the W-f is improved by about 1.5% with an $O_2$ implant barrier formed after the Si EPI layer, as compared to the trend line 362.

It is understood that various known processes can be used to fabricate the device 200, in addition to the unique processes and process sequences discusses above. Known processes include film deposition, lithography, etching, ion implantation process, chemical mechanical polishing, and cleaning. In some embodiments, the film deposition process includes a physical vapor deposition (PVD) process such as evaporation and DC magnetron sputtering, a plating process such as electrode-less plating or electroplating, a chemical vapor deposition (CVD) process such as atmospheric pressure CVD (APCVD), low pressure CVD (LPCVD), plasma enhanced CVD (PECVD), or high density plasma CVD (HDP CVD), ion beam deposition, spin-on coating, metalorganic decomposition (MOD), atomic layer deposition (ALD) process and/or other suitable methods.

In some embodiments, the lithography process includes coating a resist film on a wafer substrate, exposing the resist film by an optical lithography tool or an electron beam writer, and developing the exposed resist film to form a resist pattern for an ion implantation process or an etching process. Coating the resist film on the wafer substrate includes performing a dehydration process before applying the resist film on the wafer substrate, which can enhance an adhesion of the resist film to the wafer substrate. The dehydration process includes baking the substrate at a high temperature for a duration of time, or applying a chemical such as hexamethyldisilizane (HMDS) to the substrate. Coating the resist film on the wafer substrate includes a soft bake (SB). Exposing the resist film includes using a mask. Different kinds of masks include a binary mask (BIM), a super binary mask (SBIM), or a phase shift mask (PSM), which includes an alternative phase shift mask (alt. PSM) or an attenuated phase shift mask (att. PSM). Different kinds of optical lithography tools include an I-line, a deep ultraviolet (DUV), or an extreme ultraviolet (EUV) tool. Developing includes a post exposure bake (PEB), a post develop bake (PDB) process, or a combination thereof.

In some embodiments, the etching process includes a dry (plasma) etching, a wet etching, and/or other etching methods. For example, a dry etching process is implemented with an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof.

Thus, the present disclosure describes a semiconductor device and a method for making such device. In one embodiment, the semiconductor device includes a substrate having an isolation feature around a well in the substrate. The well includes a first dopant. The device also includes a source and a drain over the well, a gate electrode, and a channel between the source and the drain. The channel includes a second dopant. The device also includes a barrier layer disposed between the channel and the well. The barrier layer includes molecular oxygen.

In one embodiment, a method for fabricating a semiconductor device includes receiving a silicon substrate having an isolation feature disposed on the substrate and a well adjacent the isolation feature, wherein the well includes a first dopant. The method also includes etching a recess to remove a portion of the well and epitaxially growing a silicon layer (EPI layer) in the recess to form a channel, wherein the channel includes a second dopant. The method also includes forming a barrier layer between the well and the EPI layer, the barrier layer including at least one of either silicon carbon or silicon oxide. The barrier layer can be formed either before or after the channel. The method further includes forming a gate electrode disposed over the channel and forming a source and drain in the well.

In another embodiment, a method for fabricating a semiconductor device includes receiving a wafer substrate, forming an isolation feature in the wafer substrate, and forming a well having a first dopant in the wafer substrate. The method also includes etching a recess in the well and forming a layer in the recess, the layer having a second dopant. The method further includes forming an oxygen-containing barrier layer between the well and the layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
a semiconductor substrate;
a well feature disposed in the semiconductor substrate;
an isolation feature disposed in the semiconductor substrate and interfacing with the well feature;
a first silicon-containing layer disposed directly on the well feature such that a first interface is formed between the first silicon-containing layer and the well feature, the first interface positioned at a first height in the device, the first silicon-containing layer having a bottom surface facing the semiconductor substrate and an opposing top surface facing away from the semiconductor substrate;
a semiconductor layer disposed directly on the first silicon-containing layer, the semiconductor layer being formed of a different material than the first silicon-containing layer;
a gate stack disposed on and interfacing with the semiconductor layer; and
a first source/drain feature disposed in the semiconductor substrate directly on the well feature such that a second interface is formed between the first source/drain feature and the well feature, the second interface positioned at a second height in the device, the second height being different than the first height, wherein the first source/drain feature is further disposed directly on the top surface of the first silicon-containing layer.

2. The device of claim 1, wherein the second height is less than the first height.

3. The device of claim 1, further comprising a gate structure disposed directly on the semiconductor layer.

4. The device of claim 3, wherein the gate structure includes a gate dielectric layer and a gate electrode, wherein the gate dielectric layer is disposed directly on the semiconductor layer.

5. The device of claim 3, wherein the isolation feature includes a first portion disposed in the semiconductor substrate on a first side of the gate structure and a second portion disposed in the semiconductor substrate on a second side of the gate structure, the second side of the gate structure being opposite the first side of the gate structure, and
wherein the well feature extends continuously from the first portion of the isolation feature to the second portion of the isolation feature.

6. The device of claim 1, wherein the first source/drain feature and the isolation feature extend to the same height above the semiconductor substrate.

7. The device of claim 1, wherein the first silicon-containing layer includes oxygen.

8. The device of claim 1, wherein the first silicon-containing layer includes carbon.

9. A device comprising:
a substrate having a dielectric isolation feature disposed around a well feature in the substrate, wherein the well feature includes an edge facing the dielectric isolation feature;
a source/drain feature disposed on the well feature such that the source/drain feature interfaces with the edge of the well feature that faces the dielectric isolation feature;
a barrier layer disposed on and interfacing with the well feature, wherein the barrier layer has a bottom surface facing the substrate and an opposing top surface facing away from the substrate, and wherein the source/drain feature interfaces with the top surface of the barrier layer;

a semiconductor layer disposed on and interfacing with the top surface of the barrier layer and the source/drain feature; and
a gate structure disposed on and interfacing with the semiconductor layer.

10. The device of claim 9, further comprising a sidewall spacer disposed on the gate structure and interfacing with the source/drain feature.

11. The device of claim 10 wherein the source/drain feature extends continuously from the semiconductor layer to the sidewall spacer.

12. The device of claim 9, wherein the dielectric isolation feature extends above the substrate to at least the same height as the semiconductor layer.

13. The device of claim 9, wherein the barrier layer is an oxide layer.

14. The device of claim 9, wherein the barrier layer is a carbon-containing layer.

15. The device of claim 9, wherein the well feature is disposed in a portion of the substrate,
wherein the portion of the substrate has a first width measure is a direction parallel to a top surface of the substrate,
wherein the barrier layer has the same first width as the portion of the substrate, and
wherein the semiconductor layer has a second width measured in the direction, the second width being different than the first width.

16. A device comprising:
a substrate;
a well feature disposed in the substrate;
a barrier layer disposed directly on the well feature, wherein the barrier layer has a bottom surface facing the substrate and an opposing top surface facing away from the substrate, the bottom surface of the barrier layer interfacing with the well feature;
a semiconductor layer disposed directly on the top surface of the barrier layer,
a gate dielectric layer disposed on the semiconductor layer;
a gate electrode layer disposed on the gate dielectric layer;
a source/drain feature disposed in the substrate and interfacing with the top surface of the barrier layer; and
a dielectric isolation structure disposed in the substrate, wherein the dielectric isolation structure includes a sidewall having a first portion, a second portion and a third portion, the first portion of the sidewall of the dielectric isolation structure interfacing a portion of the substrate that is free of the well feature, the second portion of the sidewall of the dielectric isolation structure interfacing with the well feature, the third portion of the sidewall of the dielectric isolation structure interfacing with the source/drain feature.

17. The device of claim 16, wherein the source/drain feature further interfaces with the semiconductor layer.

18. The device of claim 16, wherein the dielectric isolation structure extends above the substrate to at least the same height as the semiconductor layer.

19. The device of claim 18, wherein the gate dielectric layer and the gate electrode layer extend to a greater height above the substrate than the both the semiconductor layer and the dielectric isolation structure.

20. The device of claim 16, wherein the barrier layer includes an oxide material and prevents the semiconductor layer from interfacing with the well feature.

* * * * *